United States Patent [19]

Eggers et al.

[11] Patent Number: 5,032,969

[45] Date of Patent: Jul. 16, 1991

[54] TURBINE ENGINE IGNITER EXCITER CIRCUIT

[75] Inventors: Frederick W. Eggers; LeRoy B. Adam, both of Redding, Calif.

[73] Assignee: Cooper Industries, Inc., Houston, Tex.

[21] Appl. No.: 480,408

[22] Filed: Feb. 15, 1990

[51] Int. Cl.⁵ .................. H02M 3/335; F23Q 3/00
[52] U.S. Cl. ............................ 363/21; 363/86; 361/257; 123/604
[58] Field of Search ............... 363/21, 86, 96, 97, 363/124; 315/209 CD, 209 SC, 218; 361/239, 257; 123/148 CC, 604, 605, 596

[56] References Cited

U.S. PATENT DOCUMENTS 4,613,797 2/1986 Eggers et al. ............ 315/241 R
4,833,369 5/1989 White ...................... 315/209 T
4,839,772 6/1989 Choi et al. ................ 361/256
4,922,396 5/1990 Niggemeyer ................ 363/21

Primary Examiner—Peter S. Wong
Attorney, Agent, or Firm—MacMillan, Sobanski & Todd

[57] ABSTRACT

An improved turbine engine igniter exciter circuit. An oscillator circuit drives the primary winding of a transformer for charging a capacitor to a predetermined voltage greater than the voltage required to sustain a spark discharge at an igniter but less than the voltage required to establish a spark discharge at the igniter. A timing circuit periodically triggers an SCR to discharge a portion of the energy stored in the capacitor through the primary winding of a step up transformer to create a short duration high voltage ignition pulse for establishing the spark discharge. The remaining lower voltage energy in the capacitor sustains the spark discharge for a predetermined time.

12 Claims, 3 Drawing Sheets

TURBINE ENGINE IGNITER EXCITER CIRCUIT

TECHNICAL FIELD

The invention relates to high voltage power supplies and more particularly to an improved power supply circuit for supplying periodic high voltage ignition pulses to a turbine engine igniter.

BACKGROUND ART

Fuel in a turbine engine is initially ignited by a high voltage spark discharge at an igniter. Once a turbine engine is started, combustion normally will continue without further use of the igniter until the engine is stopped. However, under certain conditions the flame can be extinguished. At critical times such as during aircraft takeoffs and landings and during combat for military planes, the igniter is periodically fired, for example at from about 2 to 6 or more firings per second. If the flame should become extinguished during such time, it is immediately re-ignited.

Two similar types of igniter exciter circuits are in common use today. Both require a high voltage storage capacitor and a spark gap in the high voltage output circuit in the exciter box. In a first circuit, the high voltage ac output from a transformer is applied through a diode rectifier to charge the capacitor. Normally a mica storage capacitor is charged to about 3,000 volts. The internal spark gap is connected in series between the storage capacitor and the igniter. When the voltage across the capacitor becomes sufficient to jump the internal spark gap, the energy stored in the capacitor is discharged through the spark gap to the igniter. In a second circuit, the rectified output is applied to a capacitor connected in series with the igniter. A resistor is connected in parallel with the igniter to permit charging of the capacitor since the igniter will be essentially an open circuit until a spark discharge ionizes gases at the igniter's spark gap. A spark gap in the exciter is connected across the rectified high voltage ac output from a transformer. When the charge on the capacitor becomes sufficient to discharge across the internal spark gap, energy stored in the capacitor is discharged to the igniter. In both types of igniter exciters, the internal spark gap and the high voltage storage capacitor are expensive and the spark gap prevents accurately controlling the ignition timing. Variations in the voltage required to discharge across the internal spark gap result in variations in ignition timing between different exciters. Also, the rate at which the capacitor is charged can vary with the voltage from the external power source, which will vary the ignition timing.

DISCLOSURE OF INVENTION

According to the present invention, an improved turbine engine igniter exciter circuit is provided with an electronic switch and a timing circuit for precisely timing spark discharge for fuel ignition in a turbine engine. An oscillator circuit applies energy pulses to the primary of a transformer until the rectified output from the transformer charges a storage capacitor to a predetermined voltage. Once the capacitor is charged, only enough energy is supplied to maintain the voltage on the storage capacitor. The capacitor is charged to a voltage substantially less than the 2,500 to 3,000 volts required to initiate a spark discharge at the igniter, but greater than the approximately 50 volts required to sustain the spark discharge, once initiated. The capacitor may be charged, for example, to a voltage of from 400 volts to 1,000 volts.

A timing circuit periodically triggers an electronic switch to discharge energy stored in the capacitor through a transformer to an igniter. The initial discharge from the capacitor passes through the primary winding of the transformer for supplying a short duration pulse to an igniter at a voltage sufficient to initiate a spark discharge. At the same time, voltage on the capacitor is applied through the secondary winding of the transformer to the igniter. After the spark discharge is initiated, the remaining energy stored in the capacitor is discharged through the secondary winding of the transformer to the igniter to sustain the spark for a time after the initial high voltage discharge. Once started, the spark will be sustained until the applied voltage drops below the minimum voltage required by the igniter, typically about 50 volts.

It is an object of the invention to provide a turbine engine igniter exciter circuit which has improved efficiency and more accurate and controllable timing over prior art exciter circuits.

Other objects and advantages of the invention will be apparent from the following detailed description of a preferred embodiment and the accompanying drawings.

BEST MODE FOR CARRYING OUT THE INVENTION

Figure 1:
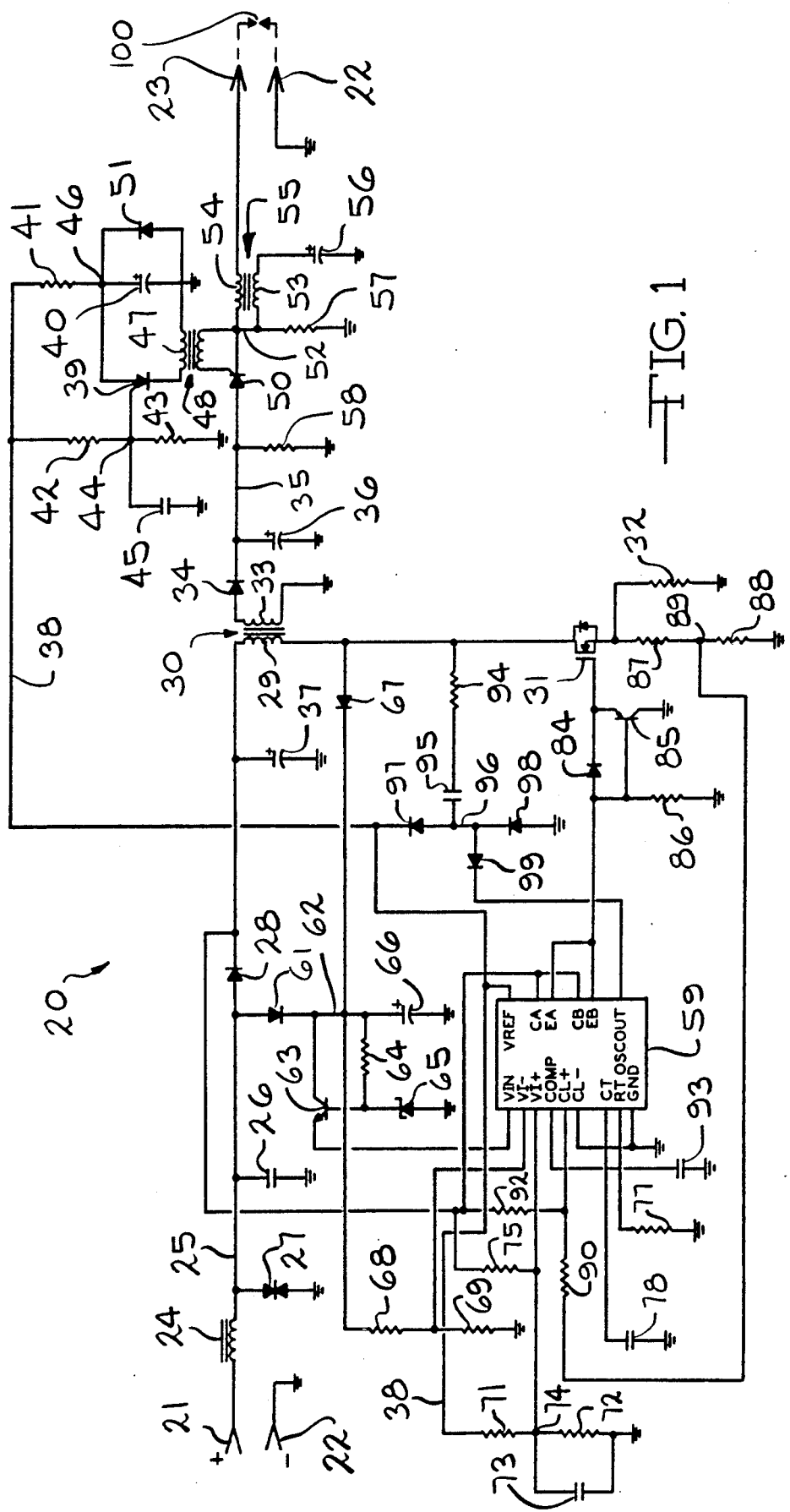
FIG. 1 is a schematic circuit diagram of an improved turbine engine igniter exciter according to one embodiment of the invention.

Referring to the FIG. 1 of the drawings, a detailed turbine engine igniter exciter circuit 20 is shown according to a preferred embodiment of the invention. The circuit 20 has a positive dc input terminal 21, a grounded terminal 22 and a high voltage output terminal 23. In operation, a low voltage dc power source (not shown) is connected between the input terminal 21 and ground. The circuit 20 is designed to operate over a wide range of input voltages, typically from about 8 volts to 32 volts. However, in order to meet aviation safety standards, the circuit will continue to operate at a substantially higher input voltage, for example, up to about 60 volts. A shielded ignition cable (not shown) is connected from the exciter output terminal 23 and ground 22 to a conventional turbine engine igniter (not shown) for initiating combustion in the engine.

The terminal 21 is connected through an inductor 24 to a line 25. The line 25 is connected through a capacitor 26 to ground and through a metal oxide varistor (MOV) 27 to ground. The inductor 24 limits surge currents and in combination with the capacitor 26 filters power at the input terminal 21. The MOV 27 is selected to have a breakdown voltage equal to the maximum voltage between the terminals 21 and 22 to protect the circuit 20 from power surges.

The line 25 is connected through a diode 28 to one end of the primary winding 29 of a transformer 30. The other end of the primary winding 29 is connected through the source and drain of a field effect transistor (FET) 31 and a very low value resistor 32 to ground. As will be explained in detail below, the FET 31 is cycled on and off to cause current to periodically flow in the primary winding 29. The transformer 30 has a secondary winding 33 which is connected at one end to ground and at the other end through a diode 34 to a line 35. A main storage capacitor 36 is connected between the line 35 and ground.

When the FET 31 is turned on or conducts, current flows from the line 25 through the diode 28 to the primary winding 29 of the transformer 30. This current causes energy to be stored in the transformer 30 in the form of a magnetic field surrounding the primary winding 29. As soon as the FET 31 is turned off or rendered non-conductive, current will no longer flow in the primary winding 29. The magnetic field about the primary winding 29 will collapse and the energy stored therein is inductively coupled to the secondary winding 33. Such energy passes through the diode 34 and is stored in the capacitor 36. Each time the FET 31 is turned on and off, an additional quantity of energy is transferred to the capacitor 36 and the voltage across the capacitor 36 increases. When a desired maximum voltage across the capacitor 36 is reached, cycling of the FET 31 is terminated. Each time the FET 31 is turned off, an induced voltage also will appear across the primary winding 29. The diode 28 and a filter capacitor 37 connected from between the diode 28 and the primary winding 29 prevents such induced voltage from traveling back to the input terminal 21.

As will be discussed below, the circuit 20 establishes a regulated or reference voltage on a line 38. The line 38 is connected to a timing circuit which includes a programmable unijunction transistor (PUT) 39, a timing capacitor 40 and a timing resistor 41. Two series resistors 42 and 43 are connected from the line 38 to ground to form a voltage divider. A junction 44 between the resistors 42 and 43 is connected through a capacitor 45 to ground and is connected to the gate of the PUT 39. The capacitor 45 filters noise from the gate of the PUT 39. The voltage applied by the voltage divider to the gate of the PUT 39 determines the anode to cathode voltage across the PUT 39 at which the PUT 39 will begin to conduct.

The line 38 is connected through the timing resistor 41 to a junction 46 and thence through the timing capacitor 40 to ground. The junction 46 also is connected through the anode/cathode of the PUT 39 and the primary winding 47 of a transformer 48 to ground. When the capacitor 40 becomes charged to a predetermined voltage as determined by the voltage divider resistors 42 and 43, the PUT 39 begins to conduct to discharge the capacitor 40 through the primary winding 47. Current through the primary winding 47 induces a voltage across a secondary winding 49 to trigger a silicon controlled rectifier (SCR) 50 into conduction. When the SCR 50 is turned on, a negative pulse may appear across the primary winding 47. This pulse could be transferred through the PUT 39 to the capacitor 40, thereby adversely affecting the timing of the next cycle. To prevent application of a negative voltage to the capacitor 40, a diode 51 is connected in parallel with the capacitor 40.

The SCR 50 is connected between the line 35 and a junction 52 which is connected to one end of a primary winding 53 and one end of a secondary winding 54 of a transformer 55. The other end of the primary winding 53 is connected through a capacitor 56 to ground and the other end of the secondary winding 54 is connected to the high voltage output terminal 23. A resistor 57 also is connected from the junction 52 to ground. When the SCR 50 initially begins to conduct, a small portion of the energy stored in the capacitor 36 discharges to ground through the SCR 50, the primary winding 53 and the capacitor 56. This initial discharge induces a high voltage across the secondary winding 54 which is added to the voltage that appears across the storage capacitor 36. As a consequence, a very short high voltage ignition pulse is applied to the terminal 23 and thence to the igniter spark gap (illustrated by dashed lines 100) for breaking down the igniter spark gap 100. The capacitor 56 prevents continued conduction through the primary winding 53. Consequently, only the voltage from the storage capacitor 36, as appears on the junction 52 will be applied to the igniter spark gap 100 after the initial ignition pulse. This voltage will continue the arc across the igniter spark gap 100 until the voltage of the capacitor 36 drops to below the spark sustaining voltage of about 50 volts.

In an exemplary exciter circuit 20, the capacitor 36 is initially charged to a predetermined voltage. When the SCR 50 is fired, a short duration ignition pulse is applied to the igniter to establish a spark discharge and this pulse is followed by the voltage remaining on the capacitor 36 to maintain the spark discharge for a predetermined time. Sometimes as an igniter begins to age, it will periodically misfire. In this event, the resistor 57 discharges the capacitor 56. If the resistor 56 is omitted and the igniter misfires, the charge remaining on the capacitor 56 will prevent current flow through the primary winding 53 when the SCR 50 next fires. As a consequence, no ignition pulse is produced and only the voltage on the capacitor 36 is applied to the igniter. This voltage will be insufficient to fire the igniter. A large value safety resistor 58 is connected from the line 35 to ground in parallel with the capacitor 36. The resistor 58 bleeds off and discharges the capacitor 36 over a period of time in the event that the igniter fails to fire to protect personnel who may service the exciter circuit 20 from a possible shock.

The charging of the capacitor 36 is controlled by a pulse width modulator represented by an integrated circuit (IC) 59 and related circuit components which control operation of the FET 31. The IC 59 may be a commercially available pulse width modulator which provides a pulse train with a variable frequency to control the "on" and "off" time of the FET 31. A block diagram illustrating essential internal components of the IC 59 is provided in FIG. 2. However, it will be appreciated that other pulse width modulator circuits may be used and the the IC 59 may be replaced with hard wiring which performs the same electrical functions.

Figure 2:
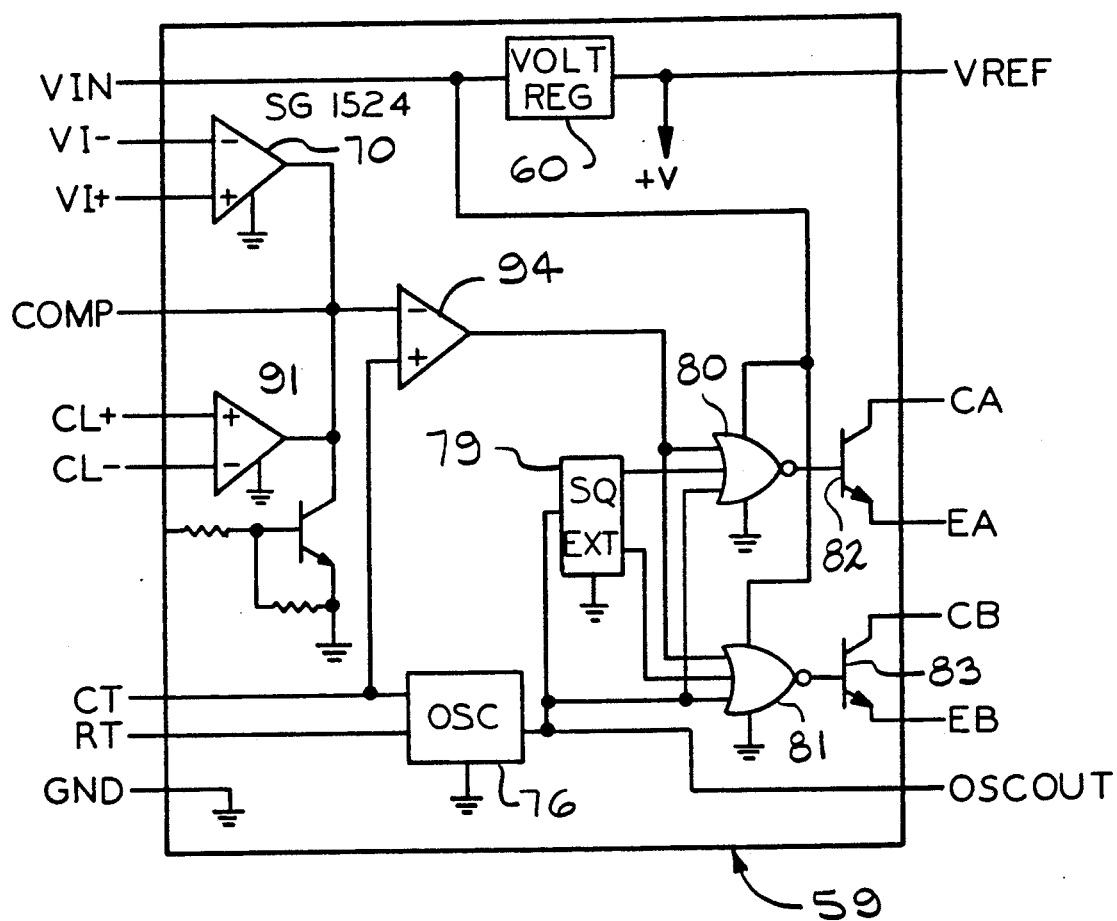
FIG. 2 is a block diagram illustrating essential internal components in an exemplary pulse width modulator integrated circuit incorporated in the circuit of FIG. 1.

Referring to both FIGS. 1 and 2, IC 59 includes an internal voltage regulator 60 having a regulated output voltage on a pin connected to the line 38. The input voltage appearing on the line 25 is applied through a diode 61 to a junction 62 connected to the collector of a transistor 63. The emitter of the transistor 63 is connected to provide an unregulated, but limited input voltage to the IC 59. A resistor 64 is connected between the collector and the base of the transistor 63 and a zener diode 65 is connected from the base to ground. A capacitor 66 is connected from the junction 62 to ground. The zener diode 65 may be selected with a break down voltage on the order of 28 volts, for example, to limit the maximum unregulated voltage applied to the voltage input to the IC 59, thus protecting IC 59 from higher input voltages. The junction 62 also is connected through a diode 67 to the end of the transformer primary winding 29 connected to the FET 31 and is connected through two series resistors 68 and 69 to ground.

The diode 67, which has a very fast response time, tends to charge the capacitor 66 to a voltage above the voltage on the line 25. Each time a voltage pulse appears across the secondary winding 33 of the transformer 30 for charging the capacitor 36, a voltage pulse also is induced across the primary winding 29. This voltage pulse is applied through the diode 67 to the capacitor 66 to impart a charge on the capacitor 66 having a level which reflects the charge on the capacitor 36. The charge on the capacitor 66 provides feedback to the IC 59 on the level of charge on the capacitor 36 without a direct connection to the secondary circuit of the transformer 30. The resistors 68 and 69 form a voltage divider for applying a predetermined portion of voltage on the capacitor 66 to a pin on the IC 59 which is connected to the negative input to a voltage comparator 70.

The reference voltage line 38 from the IC 59 is connected through two series resistors 71 and 72 to ground. A capacitor 73 is connected in parallel with the resistor 72. A junction 74 between the resistors 71 and 72 is connected through a resistor 75 to the cathode of the diode 28 and is connected through a pin on the IC 59 to the positive input to the voltage comparator 70. The ratio of the resistors 71 and 72 determine the voltage to which the charge on the capacitor 66 is compared by the comparator 70, and thus determine the maximum voltage to which the capacitor 36 is charged. When the voltage on the negative input to the comparator 70 reaches the fixed voltage on the positive input to the comparator 70, switching of the FET 31 is terminated to prevent overcharging of the capacitor 36.

As previously indicated, the FET 31 is turned on and off to cause the capacitor 36 to be incrementally charged. The FET 31 is controlled by circuitry in the IC 59 which is responsive to timing components and various feedback information. The IC 59 includes an internal oscillator 76 operating at a frequency determined by a resistor 77 connected from a pin on the IC 59 to ground and a capacitor 78 connected from a pin on the IC 59 to ground. The output of the oscillator 76 is applied through a squaring circuit 79 to two parallel NOR gates 80 and 81. The NOR gates 80 and 81 control two power transistor 82 and 83, respectively. The collectors of the transistors 82 and 83 are connected in parallel to the positive voltage at the cathode of the diode 28. Under normal operating conditions, the oscillator 76 is effective to cause the FET 31 to turn on only during the first cycle when the circuit 20 is activated and there is no feedback information available.

The emitters of the transistors 82 and 83 are connected together through a diode 84 to drive the gate of the FET 31. The diode 84, a transistor 85 and a resistor 86 form a known circuit for speeding up the operation of the FET 31. The resistor 86 is connected from the anode of the diode 84 to ground. The emitter of the transistor 85 is connected to the cathode of the diode 84, the collector of the transistor 85 is connected to ground and the base of the transistor 85 is connected to the anode of the diode 84. The circuit including the diode 84, the transistor 85 and the resistor 86 makes the negative edge of the output from the transistors 82 and 83 in the IC 59 faster for a faster turn off the FET 31.

If the FET 31 is turned on and remains on, the energy stored in the transformer 30 will increase as the current through the primary winding 29 increases until saturation occurs. At saturation, the inductance of the primary winding will be minimum and thus any further increase in current will result in significant losses due to thermal dissipation. In order to avoid operating the transformer 30 at or near saturation, the circuit 20 includes an antisaturation circuit for sensing and interrupting the current in the primary winding 29. As previously stated, current through the primary winding 29 and the FET 31 flows to ground through the resistor 32 which has a predetermined low value. A low voltage is established across the resistor 32 which is proportional to the current in the primary winding 29. A voltage divider consisting of two series resistors 87 and 88 is connected across the resistor 32. The resistors 87 and 88 have a total value substantially larger than the value of the resistor 32. A junction 89 between the resistors 87 and 88 is connected through a resistor 90 through a pin on the IC 59 to the positive input to a current limit comparator 91. The positive input to the comparator 91 also is connected through a resistor 92 to the cathode of the diode 28. The negative input to the comparator 91 is connected to ground.

A capacitor 93 is connected from ground through a pin on the IC 59 to the negative input to a comparator amplifier 94. The outputs from the comparators 70 and 91 also are connected to the negative input to the comparator 94. The output of the comparator 94 is connected in parallel to inputs to the NOR gates 80 and 81. As a consequence, the output from the comparator 70 inhibits the emitter outputs from the transistors 82 and 83 to stop conduction of the FET 31 when the charge or voltage on the capacitor 36 reaches a desired maximum level and the output from the comparator 91 inhibits the emitter outputs from the transistors 82 and 83 to stop conduction of the FET 31 when the current through the primary winding 29 of the transformer 30 reaches a desired maximum below the saturation level.

In order to assist quickly turning off the FET 31, a circuit is provided for feeding back a signal to IC 59 when the diode 34 begins to conduct. A series connected resistor 94 and capacitor 95 are connected from the end of the primary winding 29 connected to the FET 31 to a junction 96. The junction 96 is connected through a diode 97 to the reference voltage line 38 and through a diode 98 to ground. The diodes 97 and 98 clamp the voltage on the junction 96 to between the reference voltage and the ground potential. The junction 96 is further connected through a diode 99 and a pin on the IC 59 to the input to the squaring circuit 79, along with the output from the oscillator 76. When the FET 31 stops conduction and a sufficient voltage is induced across the secondary winding 33 to turn on the diode 34, the initial voltage simultaneously induced across the primary winding 29 will pass through the resistor 94, the capacitor 95 and the diode 99 to inhibit the output from the oscillator 76 and the squaring circuit 79, thereby turning off the FET 31 while energy is transferred to the capacitor 36. In normal operation of the circuit 20, this feedback signal will cause the FET 31 to cycle at a frequency much higher than the operating frequency of the oscillator 76.

In operation, the FET 31 is cycled at a high frequency until the capacitor 36 is charged to a predetermined voltage. The capacitor 66 is charged to a voltage indicative of the charge on the capacitor 36. When the voltage on the capacitor 66 reaches a predetermined level, the output from the comparator 70 changes and the FET 31 is no longer cycled. Each time the FET 31 is turned on, the current through the primary winding 29 of the transformer 30 is sensed. If this current reaches a predetermined maximum level, the FET 31 is turned off by the IC 59 before saturation of the transformer 30. The FET 31 also is turned off whenever energy is being transferred from the transformer 30 through the diode 34 to the capacitor 36 by a flyback circuit including the resistor 94, the capacitor 95 and the diode 99. Once the capacitor 36 is charged, it remains charged until a timing circuit including the PUT 39 triggers the SCR 50 to discharge the capacitor 36 through the transformer 55 to the turbine engine igniter. The transformer 55 provides a short duration leading high voltage ignition pulse to the igniter gap 100 to initiate the spark before the main charge stored in the capacitor 36 is discharged to the igniter spark gap 100.

Figure 3:
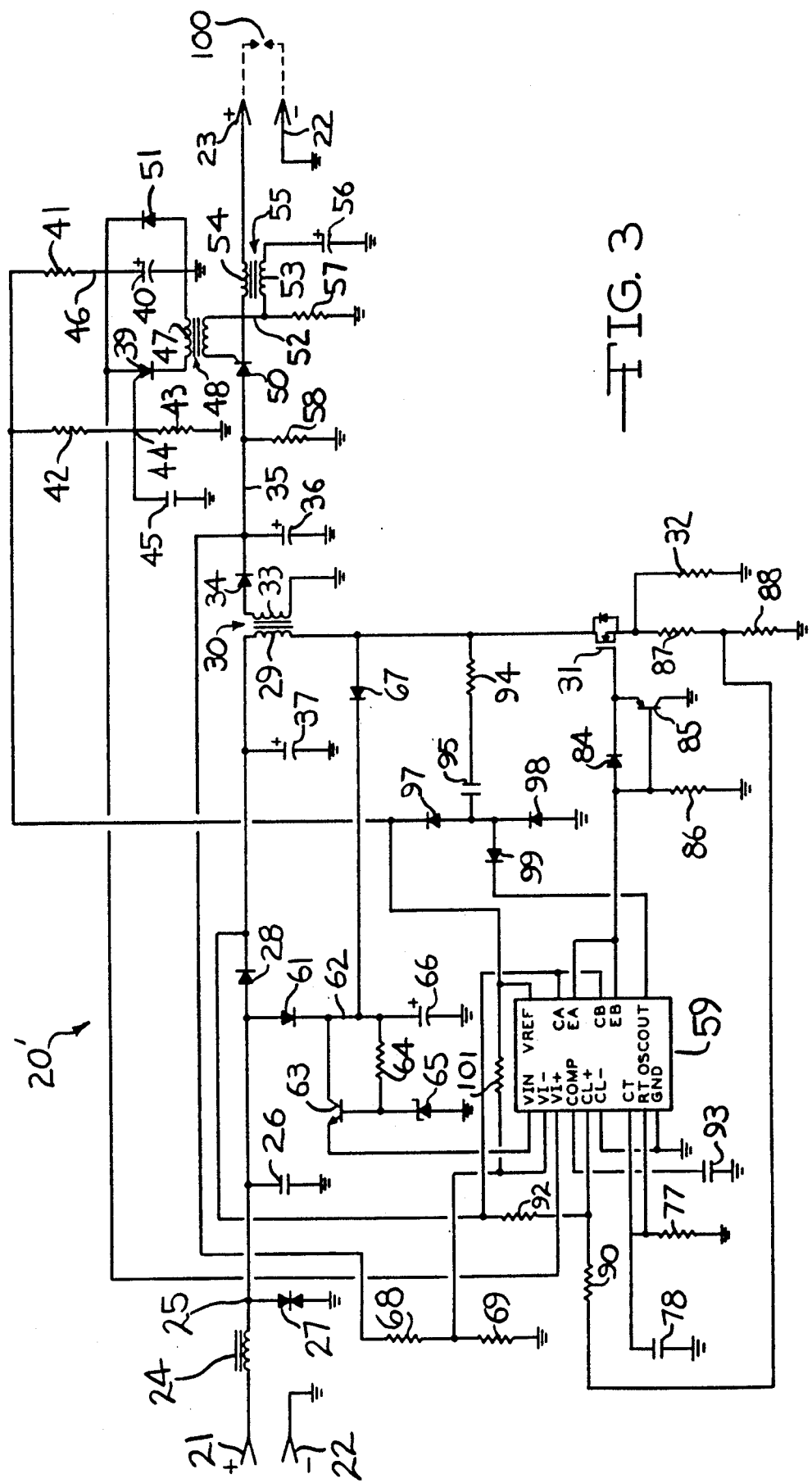
FIG. 3 is a schmetic circuit diagram of an improved turbine engine igniter exciter according to a modified embodiment of the circuit of FIG. 1.

FIG. 3 shows a circuit 20' which is a modification of the turbine engine igniter exciter circuit 20 of FIG. 1. Circuit components in FIG. 3 which correspond to components in FIG. 1 have been labeled with the same reference numbers. The circuit 20 of FIG. 1 has one disadvantage, namely, that there is no control over the rate that the storage capacitor 36 charges. If the capacitor 36 is charged more rapidly than is necessary, the circuit 20 will draw a more uneven power from the dc power source connected to the terminals 21 and 22. The circuit 20' is modified to provide control over the rate which the capacitor 36 charges to cause the circuit 20' to draw dc power more evenly from the source connected to the terminals 21 and 22.

The voltage on the timing capacitor 40 which controls firing of the PUT 39 exhibits a classical charging curve independent of the exciter input voltage because the circuit for the PUT 39 is operated from the regulated or reference voltage from the IC 59. The voltage on the capacitor 40 is fed back to the pulse width modulator VI+ input pin. The VI− input pin on the IC 59 is connected through junction 74 and the voltage divider resistors 68 and 69 to sample the voltage on the capacitor 36. The VI− input pin on the IC 59 also is connected through a resistor 101 to the reference voltage output from the IC 59. Consequently, the comparator 70 (FIG. 2) compares the voltage on the capacitor 40 with a portion of the voltage on the capacitor 36 determined by the voltage divider resistors 68 and 69. This assures that the storage capacitor 36 will always exhibit a classical charging curve and will reach full voltage at the exact time that the SCR 50 fires. Thus, the timing capacitor 40 voltage waveform becomes the timing and voltage reference for the entire exciter.

While a preferred embodiment of the exciter circuit 20 has been described and illustrated, it will be appreciated that various modifications and changes may be made to the circuit without departing from the spirit and the scope of the following claims.

We claim:

1. An exciter circuit for an igniter in a turbine engine, said igniter requiring a first predetermined high voltage to initiate a spark discharge and a second substantially lower voltage for sustaining such spark discharge once such spark discharge is initiated, said circuit comprising an electronic switch having two switched terminals and a gate terminal, a first capacitor connected between one switched terminal of said switch and ground, means for charging said first capacitor to a predetermined voltage greater than said second voltage and less than said first voltage, a transformer having a primary winding with first and second ends and a secondary winding with first and second ends, a second capacitor connected between said second end of said primary winding and ground, means connecting said first ends of said primary and secondary windings to the other terminal of said switch, means for connecting said second end of said secondary winding to said igniter, and timing means for periodically applying trigger signals to said gate terminal of said switch to discharge energy in said first capacitor to said igniter, wherein an initial flow of current through said primary winding and said second capacitor induces a voltage across said secondary winding which when combined with the voltage on said first capacitor is greater than said first voltage to initiate a spark discharge at said igniter and remaining energy in said first capacitor is discharged to said igniter at substantially the voltage on said first capacitor.

2. An exciter circuit for an igniter in a turbine engine, as set forth in claim 1, and including means for limiting the voltage to which said first capacitor is charged.

3. An exciter circuit for an igniter in a turbine engine, as set forth in claim 1, wherein said electronic switch comprises an SCR.

4. An exciter circuit for an igniter in a turbine engine, as set forth in claim 3, wherein said timing means comprises an oscillator having an output with a predetermined frequency, and means responsive to said oscillator output for triggering said SCR.

5. An exciter circuit for an igniter in a turbine engine, as set forth in claim 1, and further including a resistor connected between said first ends of said primary and secondary windings and ground, said resistor discharging said second capacitor in the event that the igniter misfires.

6. An exciter circuit for an igniter in a turbine engine, as set forth in claim 1, wherein said means for charging said first capacitor includes a low voltage dc power source, a second transformer having primary and secondary windings, a second electronic switch having switched terminals and a gate, means connecting said switched terminals of said second switch and said second transformer primary winding in series across said power source, means connected to said gate of said second switch for periodically turning said second switch on and off, a diode, and means connecting said secondary winding of said second transformer, said diode and said first capacitor in a closed series circuit, whereby energy induced in said secondary winding of said second transformer when said second switch is turned off charges said first capacitor.

7. An exciter circuit for an igniter in a turbine engine, as set forth in claim 6, and including means for interrupting operation of said second switch when said first capacitor is charged to a predetermined voltage less than said first voltage.

8. An exciter circuit for an igniter in a turbine engine, as set forth in claim 6, and including means responsive to a predetermined maximum current in said primary winding of said second transformer when said second switch is on for turning said second switch off.

9. An exciter circuit for an igniter in a turbine engine, as set forth in claim 6, and including means for initiating turning on of said second switch upon transfer of energy from said secondary winding of said second transformer through said diode to said first capacitor.

10. An exciter circuit for an igniter in a turbine engine, as set forth in claim 1, wherein said means for charging said first capacitor charges said first capacitor at a rate controlled to reach said predetermined voltage at the time said timing means applies a trigger signal to said gate terminal.

11. An exciter circuit for an igniter in a turbine engine, said igniter requiring a predetermined high first voltage to initiate a spark discharge and a substantially lower second voltage for sustaining such spark discharge once such spark discharge is initiated, said circuit comprising an energy storage capacitor, means for charging said capacitor to a predetermined voltage less than said first voltage and at least as great as said second voltage, electronic switch means responsive to a trigger signal for discharging the voltage on said capacitor to said igniter, timing means for periodically applying a trigger signal to said switch means, and means responsive to the discharge of voltage from said capacitor to said igniter for initially increasing the voltage applied from said capacitor to said igniter to at least said predetermined high voltage.

12. An exciter circuit for an igniter in a turbine engine, as set forth in claim 11, wherein said means for charging said capacitor charges said capacitor at a rate controlled to reach said predetermined voltage at the time said timing means applies a trigger signal to said switch means.

* * * * *